US012672443B2

(12) United States Patent　　　　　(10) Patent No.:　US 12,672,443 B2
Cho et al.　　　　　　　　　　　　　 (45) Date of Patent:　Jun. 30, 2026

(54) LIGHT EMITTING DISPLAY DEVICE

(71) Applicant: LG Display Co., Ltd., Seoul (KR)

(72) Inventors: Kyung Hyun Cho, Gumi-si (KR); Geun Gi Lee, Gumi-si (KR); Woo Sang Kim, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 611 days.

(21) Appl. No.: 17/991,623

(22) Filed: Nov. 21, 2022

(65) Prior Publication Data

US 2023/0217750 A1　　Jul. 6, 2023

(30) Foreign Application Priority Data

Dec. 31, 2021　(KR) ........................ 10-2021-0194739

(51) Int. Cl.
| | |
|---|---|
| *H10K 59/131* | (2023.01) |
| *H10K 50/844* | (2023.01) |
| *H10K 59/124* | (2023.01) |
| *H10K 59/126* | (2023.01) |
| *H10K 59/88* | (2023.01) |

(52) U.S. Cl.
CPC ......... *H10K 59/131* (2023.02); *H10K 50/844* (2023.02); *H10K 59/124* (2023.02); *H10K 59/126* (2023.02); *H10K 59/88* (2023.02)

(58) Field of Classification Search
CPC ................ H10K 59/82; H10K 59/124; H10K 59/80522; H10K 59/126; H10K 59/88; H10K 59/873; H10K 59/131; H10K 50/844
See application file for complete search history.

(56) References Cited

U.S. PATENT DOCUMENTS

| | | | |
|---|---|---|---|
| 7,985,968 B2 | 7/2011 | Yamamoto et al. | |
| 8,080,936 B2 | 12/2011 | Fujimura et al. | |
| 8,766,241 B2 | 7/2014 | Yamazaki et al. | |
| 10,347,187 B2 | 7/2019 | An et al. | |
| 10,797,127 B2 | 10/2020 | Son | |
| 10,872,948 B2 | 12/2020 | Son | |
| 10,971,562 B2 | 4/2021 | Lee et al. | |
| 11,665,920 B2 | 5/2023 | Lee et al. | |
| 2009/0200937 A1 | 8/2009 | Sagawa et al. | |
| 2019/0198600 A1* | 6/2019 | Son ...................... | H10K 50/11 |
| 2020/0027943 A1* | 1/2020 | Kim ...................... | H10K 77/10 |
| 2020/0203653 A1* | 6/2020 | Um ...................... | H10D 86/443 |

(Continued)

FOREIGN PATENT DOCUMENTS

| | | |
|---|---|---|
| CN | 107527933 A | 12/2017 |
| CN | 109979968 A | 7/2019 |

(Continued)

*Primary Examiner* — Vongsavanh Sengdara
(74) *Attorney, Agent, or Firm* — Seed Intellectual Property Law Group LLP

(57) ABSTRACT

Disclosed is a light emitting display device configured such that a power line that supplies source voltage from a pad unit and a cathode are connected to each other using a trench provided in a planarization layer so as to have a linear shape, whereby reliability in prevention of permeation is improved, an area that protrudes and is processed for a connection portion is minimized, whereby a non-display area is reduced, a cathode connection portion is located in a wide area to increase a heat generation path, whereby reliability is improved.

24 Claims, 7 Drawing Sheets

(56) References Cited

U.S. PATENT DOCUMENTS

| | | | | |
|---|---|---|---|---|
| 2020/0212356 A1* | 7/2020 | Kim | ................... | H10K 59/124 |
| 2020/0273937 A1* | 8/2020 | Son | ................... | H10K 50/84 |
| 2021/0013287 A1* | 1/2021 | Bang | ................... | G06F 1/1652 |
| 2021/0151712 A1* | 5/2021 | Lee | ................... | H10K 59/80522 |
| 2021/0183986 A1 | 6/2021 | Shin et al. | | |
| 2021/0359266 A1* | 11/2021 | Bang | ................... | H10K 59/121 |
| 2021/0408441 A1 | 12/2021 | Lee et al. | | |

FOREIGN PATENT DOCUMENTS

| | | |
|---|---|---|
| CN | 110010652 A | 7/2019 |
| CN | 110739329 A | 1/2020 |
| CN | 112820759 A | 5/2021 |
| EP | 3694010 A1 | 8/2020 |
| JP | 2006054111 A | 2/2006 |
| JP | 2009098533 A | 5/2009 |
| JP | 2009192682 A | 8/2009 |
| JP | 2009295911 A | 12/2009 |
| JP | 2020531879 A | 11/2020 |
| KR | 10-2020-0074728 A | 6/2020 |
| KR | 10-2021-0075441 A | 6/2021 |

* cited by examiner

LIGHT EMITTING DISPLAY DEVICE

CROSS-REFERENCE TO RELATED APPLICATION

This application claims the benefit of Korean Patent Application No. 10-2021-0194739, filed on Dec. 31, 2021, which is hereby incorporated by reference as if fully set forth herein.

BACKGROUND

Technical Field

The present disclosure relates to a display device, and more particularly to a light emitting display device configured such that reliability in connection between a power line that supplies source voltage from a pad unit and a cathode is improved.

Description of the Related Art

With recent approach to a full-scale information age, displays capable of visually expressing electrical information signals have been rapidly developed. Correspondingly, various display devices having excellent performance, such as slimness, light weight, and low power consumption, have been developed.

Among the display devices, a light emitting display device having a light emitting element in a display panel has been considered as a competitive application in order to achieve compaction of the device and vivid color display without necessity of a separate light source.

Meanwhile, the light emitting display device has a light emitting element independently driven for each subpixel, wherein the light emitting element includes an anode and a cathode opposite each other and an emission layer provided between the anode and the cathode.

The cathode is provided over a plurality of subpixels, and it is necessary to apply source voltage to the cathode in order to drive the light emitting element.

BRIEF SUMMARY

When an area in which a source voltage line and a cathode are connected to each other is a local area, the length of a link unit for the connection area is increased, and an encapsulation portion must be further provided outside the connection area for reliability, whereby a non-display area is increased. In addition, when the area in which the source voltage line and the cathode are connected to each other is located between adjacent pad units spaced apart from each other, source voltage is radially supplied, whereby heat may be excessively generated in the connection area.

Accordingly, one or more embodiments of the present disclosure is directed to a light emitting display device that substantially obviates one or more problems due to limitations and disadvantages of the related art including the technical problem identified above.

One or more embodiments of the present disclosure provide a light emitting display device configured such that a trench is provided in a planarization layer so as to be parallel to one side of a substrate at which a pad unit is located while having a linear shape, whereby a structure in which a cathode and a source voltage line are connected to each other is formed, and therefore it is possible to reduce the length of a link unit, to reduce a non-display area, to distribute heat over a large area, and to achieve stability in prevention of permeation.

In a light emitting display device according to the present disclosure, a linear trench parallel to one side of a substrate is provided in a planarization layer of a non-display area of the substrate, a connection line configure to supply a source voltage signal to a cathode is located at the trench, whereby resistance of a connection portion of the cathode is reduced and a heat generation path is increased, and therefore it is possible to prevent concentration in current density, and the shape of the planarization layer is divided based on the trench, whereby a permeation path due to the planarization layer at the outside is blocked by the trench, and therefore it is possible to improve reliability in prevention of permeation.

To achieve these technical benefits and other advantages and in accordance with the purpose of the disclosure, as embodied and broadly described herein, a light emitting display device includes a substrate having a display area and a non-display area outside the display area, a pad unit provided at one side of the non-display area, the pad unit including a plurality of data pad electrodes and a power voltage pad electrode, a plurality of data lines disposed in the display area so as to be parallel to each other, a plurality of link lines configured to connect the data pad electrodes and the data lines to each other in the non-display area, a connection line provided parallel to one side of the substrate while traversing the plurality of link lines, a planarization layer configured to cover the plurality of data lines, the planarization layer having a trench configured to expose the connection line, and a cathode configured to cover the display area, the cathode being connected to the connection line through the trench.

In another aspect of the present disclosure, a light emitting display device includes a substrate having a display area including an emission portion and a transmission portion and a non-display area outside the display area, a pad unit provided at one side of the non-display area, the pad unit including a plurality of data pad electrodes and a power voltage pad electrode, a plurality of data lines disposed in the display area so as to be parallel to each other, a plurality of link lines configured to connect the data pad electrodes and the data lines to each other in the non-display area, a connection line provided parallel to one side of the substrate while traversing the plurality of link lines, a planarization layer configured to cover the plurality of data lines, the planarization layer having a trench provided parallel to one side of the substrate along the connection line, and a light emitting element provided on the planarization layer, the light emitting element including an anode, an organic layer, and a cathode, wherein the cathode is connected to the connection line through the trench.

Other systems, methods, features and advantages will be or will become apparent to one with skill in the art upon examination of the following figures and detailed description. It is intended that all such additional systems, methods, features and advantages be included within this description, be within the scope of the present disclosure, and be protected by the following claims, nothing in this section should be taken as a limitation on those claims. Further aspects and advantages are discussed below in conjunction with embodiments of the disclosure. It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

Figure 1:
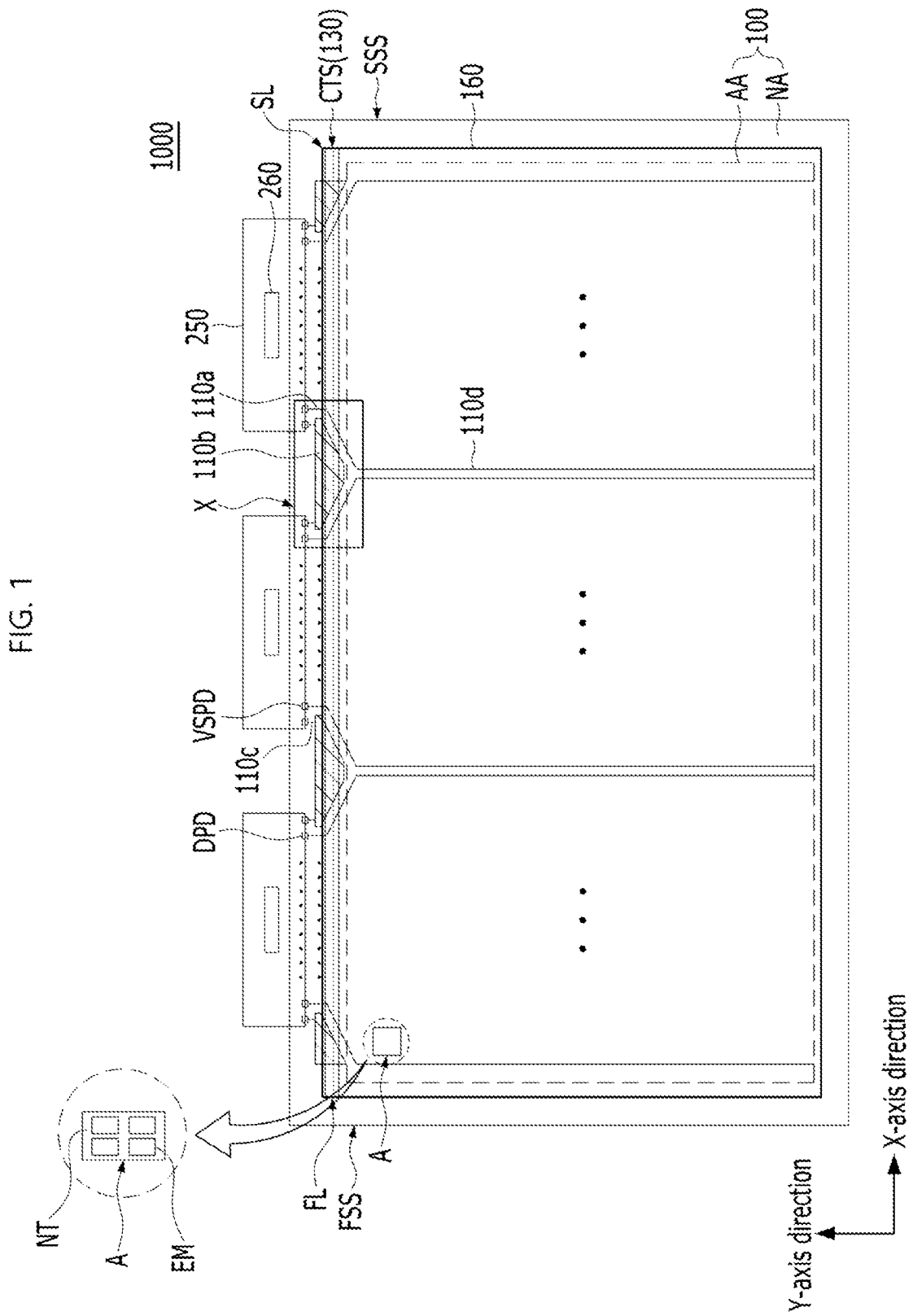
FIG. 1 is a plan view showing a light emitting display device according to a first embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Advantages and features of the present disclosure and methods of achieving the same will be more clearly understood from embodiments described below with reference to the accompanying drawings. However, the present disclosure is not limited to the following embodiments and may be implemented in various different forms. The embodiments are provided merely to complete the disclosure of the present disclosure and to fully inform a person having ordinary skill in the art to which the present disclosure pertains of the category of the disclosure. The disclosure may be defined by the category of the claims.

In the drawings for explaining the exemplary aspects of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear. The terms "comprises," "includes," and/or "has," used in this specification, do not preclude the presence or addition of other elements unless used along with the term "only." The singular forms are intended to include the plural forms as well, unless the context clearly indicates otherwise.

In the interpretation of constituent elements included in the various aspects of the present disclosure, the constituent elements are interpreted as including an error range even if there is no explicit description thereof.

In the description of the various aspects of the present disclosure, when describing positional relationships, for example, when the positional relationship between two parts is described using "on," "above," "below," "next to," or the like, one or more other parts may be located between the two parts unless the term "directly" or "closely" is used.

In the description of the various aspects of the present disclosure, when describing temporal relationships, for example, when the temporal relationship between two actions is described using "after," "subsequently," "next," "before," or the like, the actions may not occur in succession unless the term "directly" or "just" is used therewith.

In the description of the various aspects of the present disclosure, although terms such as, for example, "first" and "second" may be used to describe various elements, these terms are merely used to distinguish the same or similar elements from each other. Therefore, in the present specification, an element indicated by "first" may be the same as an element indicated by "second" without exceeding the technical scope of the present disclosure, unless otherwise mentioned.

The respective features of the various aspects of the present disclosure may be partially or wholly coupled to and combined with each other, and various technical linkages and modes of operation thereof are possible. These various aspects may be performed independently of each other, or may be performed in association with each other.

Figure 2:
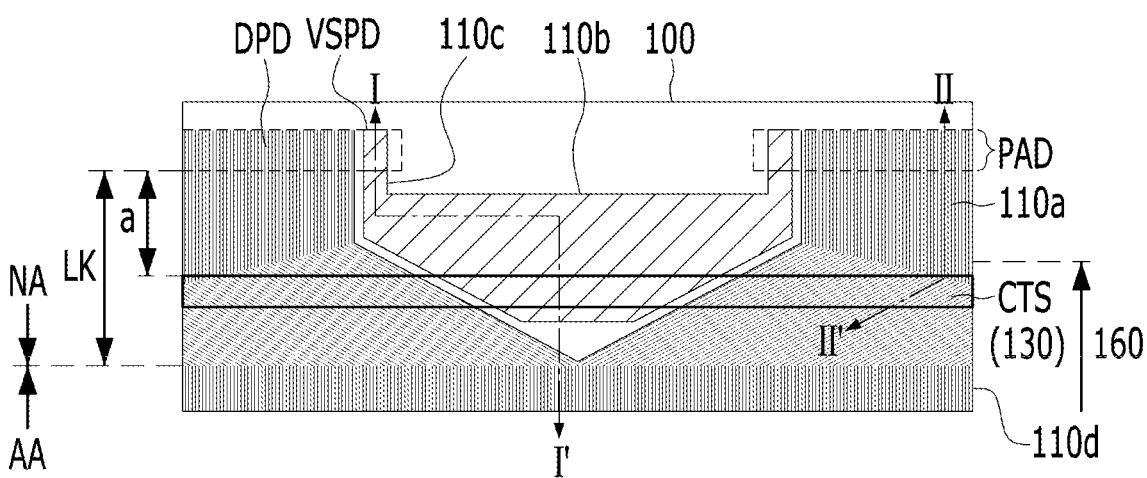
FIG. 2 is an enlarged view showing region X of FIG. 1.
Figure 3:
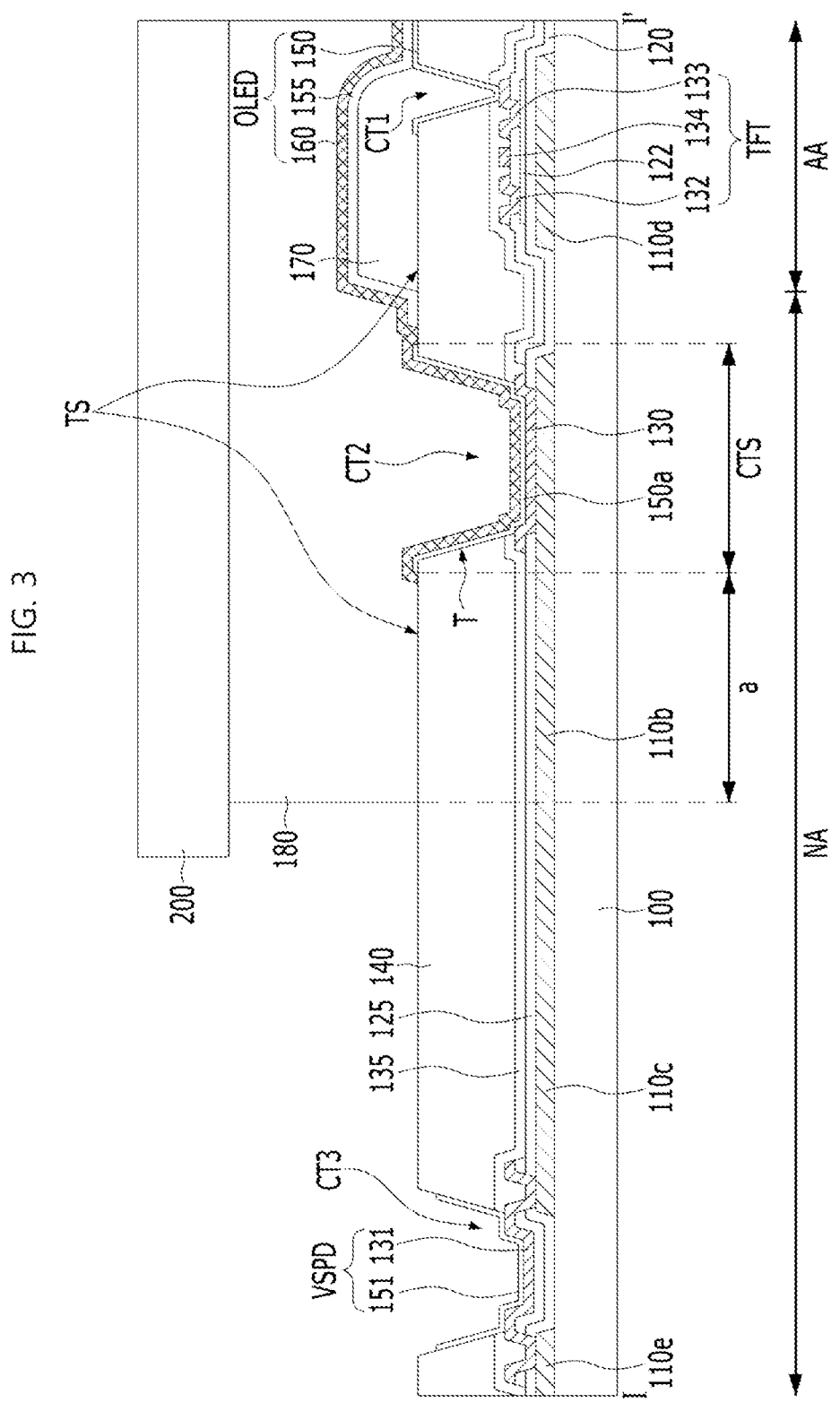
FIG. 3 is a sectional view taken along line I-I' of FIG. 2.
Figure 4:
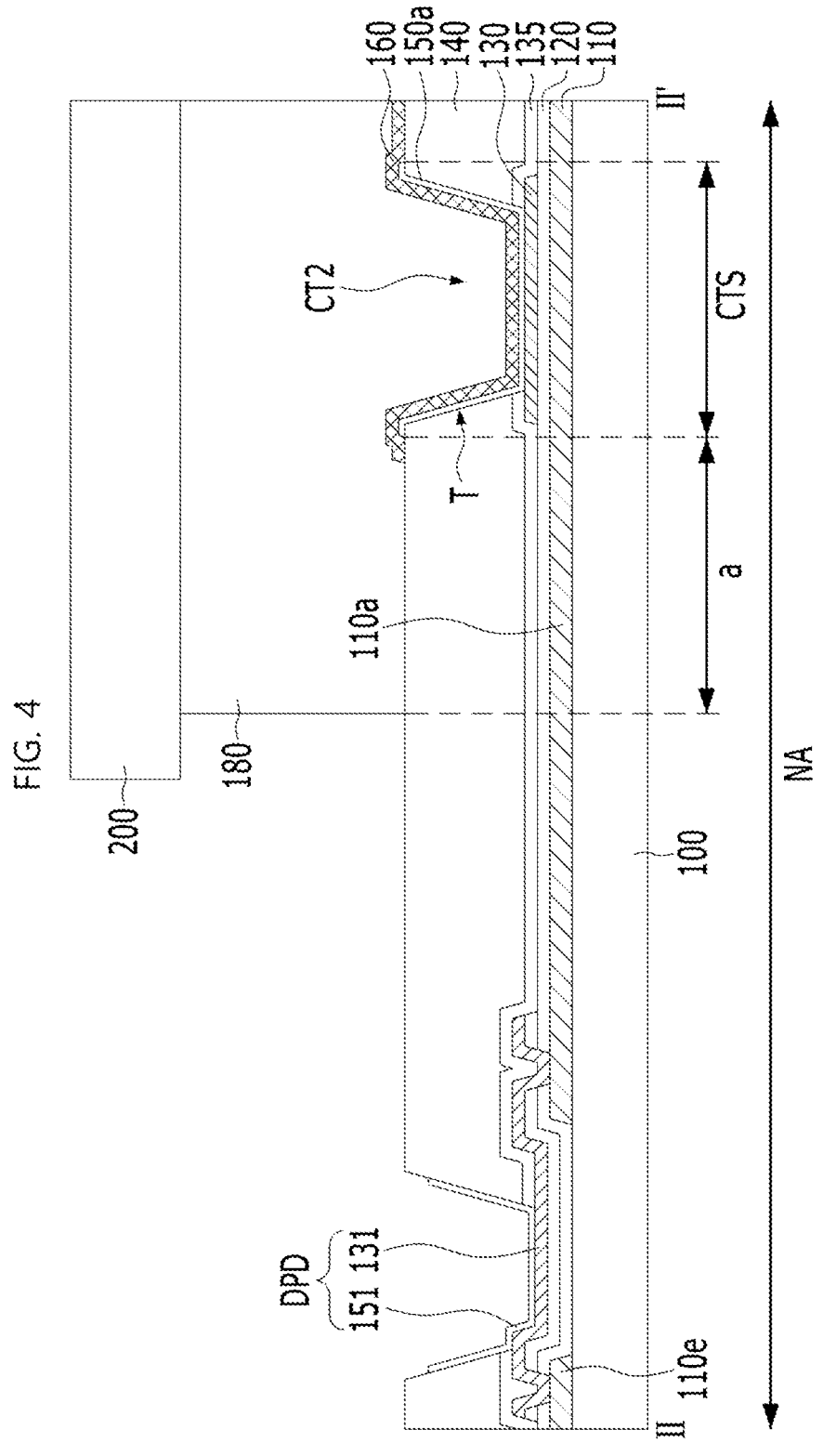
FIG. 4 is a sectional view taken along line II-II' of FIG. 2.

FIG. 1 is a plan view showing a light emitting display device according to a first embodiment of the present disclosure, FIG. 2 is an enlarged view showing region X of FIG. 1, FIG. 3 is a sectional view taken along line I-I' of FIG. 2, and FIG. 4 is a sectional view taken along line II-II' of FIG. 2.

As shown in FIGS. 1 to 4, the light emitting display device 1000 according to the first embodiment of the present disclosure may include a substrate 100 having a display area AA and a non-display area NA outside the display area, a pad unit PAD provided at one side of the non-display area NA, the pad unit including a plurality of data pad electrodes DPD and a power voltage pad electrode (or also referred to as 'a source voltage pad electrode') VSPD, a plurality of data lines 110 disposed in the display area AA so as to be parallel to each other, a plurality of link lines 110a configured to connect the data pad electrodes DPD and the data lines 110 to each other in the non-display area, a connection line 130 provided parallel to one side of the substrate 100 while traversing the plurality of link lines, a planarization layer 140 configured to cover the plurality of data lines 110, the planarization layer having a trench T configured to expose the connection line 130, and a cathode 160 configured to cover the display area AA, the cathode being connected to the connection line 130 through the trench T.

The trench T of the planarization layer 140 corresponds to a connection portion CTS between the connection line 130 and the cathode 160 of FIGS. 1 and 2, when viewed in plan.

The trench T provided in the planarization layer 140 has a shape corresponding to the connection line 130 and parallel to one side of the substrate 100, like the shape of the connection portion CTS of FIGS. 1 and 2, and is disposed outside at least the display area AA of the substrate so as to have a uniform width, whereby moisture or external air outside the substrate 100 is blocked by the trench T. In one embodiment, the trench T extends through the planarization layer 140 and exposes surfaces of the passivation film 135, the connection line 130, and the planarization layer 140 as illustrated in FIG. 3. In another embodiment, the trench T fully extends through the planarization layer 140. The trench T has a linear shape like the connection portion CTS illustrated in FIG. 1. The planarization layer 140 may be made of a material that can be planarized in order to compensate for a step of an array configured thereunder such that an upper surface of the planarization layer is flat, such as an organic insulating material. The organic insulating material may have relatively low resistance to moisture. In the light emitting display device according to the present disclosure, however, an upper part and a lower part of the planarization layer 140 may be divided from each other in plan view by the trench T formed at one side outside the display area so as to extend along one side of the substrate, whereby it is possible to reduce or prevent the planarization layer 140 outside the display area from affecting the planarization layer 140 in the display area under the trench T. When the trench T is formed at one or more sides of the display area AA parallel to one side of the substrate 100 having the pad unit PAD, the effect of preventing permeation of moisture into the display area AA due to the trench T may be increased. In the light emitting display device 1000 according to the present disclosure, therefore, reliability in prevention of permeation may be improved based on the trench structure (i.e., trench T) extending thorough the planarization layer 140. The planarization layer 140 has a top surface TS and the dummy electrode 150a and the cathode 160 both contacts the top surface TS of the planarization layer 140.

As shown, the display device 1000 has a first direction (i.e., X-axis direction) and a second direction (i.e., Y-axis direction) transverse to the first direction. Here, the trench T continuously extends in the first direction of the display device 1000 from a first location FL to a second location SL opposite the first location FL.

As illustrated, the first location FL is positioned adjacent to a first side surface FSS of the display device 1000 and the second location SL is positioned adjacent to a second side surface SSS of the display device 1000. The trench T extends continuously and contiguously between the first location FL and the second location SL.

As shown in FIGS. 1 and 2, the trench T may be provided parallel to one side of the substrate along the connection line 130 so as to have a linear shape, and connection between the connection line 130 and the cathode 160 may be performed along a lower width of the trench T shown in FIGS. 3 and 4. The parallel arrangement of the trench is merely an example arrangement and other arrangements may be utilized. A person of ordinary skill in the art would appreciate the technical benefit can also be achieved by using non-parallel arrangements and thus, a parallel arrangement is not a requirement.

In the light emitting display device 1000 according to the present disclosure, the connection line 130 is provided in a line shape traversing the link lines 110a connected to the data pad electrodes DPD, the connection line 130 is connected to the cathode 160 in the trench T, and current supplied to the cathode 160 is uniformly supplied to one side of the display area AA. The current is supplied to the cathode 160 along the one side of the display area AA through the connection portion CTS, thus it is possible to prevent heat from being concentrated on a local area.

The trench T may have a horizontal distance between the leftmost and rightmost ones of the data lines disposed in the display area. In FIG. 1, therefore, source voltage may be supplied to the cathode 160 through the connection portion CTS formed along the lateral side of the display area AA so as to have a linear shape, and source voltage may be supplied vertically uniformly from the linear connection portion CTS, and not from a local area, whereby it is possible to supply current having uniform density to all subpixels provided in the display area of the substrate 100.

In an experimental example in which the connection with the cathode is locally provided between two adjacent pad units, source voltage is radially supplied from a local area, whereby heat is generated from the connection with the cathode; however, the light emitting display device according to the present disclosure is capable of solving such a heat generation problem.

In addition, in a structure in which a source voltage supply portion and the cathode are connected to each other in a local area, the non-display area is lengthened in order to provide a sufficient connection area. In the light emitting display device according to the present disclosure, however, the cathode and the connection line may be connected to each other through a line parallel to one side of the substrate adjacent to a data pad unit, whereby it is possible to reduce the length of a link unit between the data pads and the data lines.

Also, in the light emitting display device according to the present disclosure, the connection line is provided so as to overlap the link lines between the data pad unit and the display area, and connection with the cathode is performed by the connection line, whereby it is not necessary to increase the length of the link lines for supplying source voltage to the cathode, and therefore it is possible to reduce the length of the link lines. Consequently, it is possible to reduce the length of the non-display area occupied by the link lines, whereby it is possible to reduce a bezel, and therefore it is possible to maximize the effective area of the substrate.

In addition, when the light emitting display device is a transparent display device including a transmission portion, it is possible to reduce the length of the link lines occupied by an opaque metal component, whereby it is possible to improve transparency of the transparent display device.

As shown in FIG. 1, the data pad electrodes DPD and the power voltage pad electrode VSPD may be located at one side of the substrate 100, and a driving integrated circuit (IC) 260 may be connected to a printed circuit film 250. The printed circuit film 250 corresponds to the data pad electrodes DPD corresponding to the data lines 110 provided at the substrate 100 and the power voltage pad electrode VSPD, and is connected thereto through connection portions corresponding thereto. FIG. 1 shows an example in which three printed circuit films 250 are provided; however, the number of the printed circuit films 250 connected to the substrate 100 may be changed depending on the number of the data lines 110 provided at the substrate 100.

The data lines 110 are located so as to correspond to the plurality of subpixels provided in the display area AA, and are provided in the display area AA of the substrate 100 at predetermined intervals. When the printed circuit films 250 are connected to one side of the substrate 100, the power voltage pad electrode VSPD corresponds to left and right ends of each printed circuit film 250, and the data pad electrodes DPD corresponds to the region between left and right ends of the power voltage pad electrode VSPD.

FIG. 2 is an enlarged view of region X of FIG. 1, showing a link line area and a partial extended area above and below corresponding to a horizontal length between adjacent printed circuit films 250. FIG. 2 shows the construction of the substrate 100 before connection of the printed circuit films 250. The data pad electrodes DPD and the power voltage pad electrode VSPD of the pad unit PAD shown in FIG. 2, which are regions connected to the printed circuit films 250, may be hidden by the printed circuit films 250 in a finished light emitting display device.

As shown in FIG. 2, the pad unit PAD may be grouped so as to correspond to the regions in which the printed circuit films 250 are located, whereby the data pad electrodes DPD may be disposed in a dense state. Consequently, the distance between the data pad electrodes DPD may be less than the distance between the data lines 110 disposed in the display area.

The pad unit PAD may be divided into a plurality of groups at one side of the substrate 100, the data pad electrodes DPD divided so as to correspond to the plurality of groups and the power voltage pad electrode VSPD may be connected to the printed circuit films 250 on the substrate, and the plurality of groups may have a first horizontal distance therebetween greater than the distance between the data pad electrodes DPD in each group. A link pattern 110*b* may be provided inside the substrate 100 based on the first horizontal distance.

The link pattern 110*b* may be connected to the power voltage pad electrode VSPD located at the outermost side of the printed circuit film 250, and may have a larger width than a link line 119*a*. The link pattern 110*b*, located so as to correspond to the area between adjacent printed circuit films 250, may have a partial hexagonal shape while being gradually narrow from an upper side to a lower side thereof. However, this is an example, and the shape of the link pattern 110*b* may be changed unless the area occupied by the link lines 110*a* is increased in order to connect the data pad electrodes DPD and the data lines 110 to each other. The link pattern 110*b* may correspond to the region between adjacent printed circuit films 250, and the link pattern 110*b* may be located between a link line 110*a* connected to the rightmost data pad electrode 260 at one of the printed circuit films 250 and a link line 110*a* connected to the leftmost data pad electrode 260 at the other printed circuit film 250 in a partial hexagonal shape while being gradually narrow from an upper side to a lower side thereof.

The partial hexagonal shape may be split in half (right and left) at opposite sides of the connection portion CTS between the cathode 160 and the connection line 130. The shape of the link pattern 110*b* shown in FIG. 1 is an example, and the shape of the link pattern may be changed as long as the shape of the link pattern corresponds to a space between the spaced link lines 110*a*. The link pattern 110*b* may be connected to the power voltage pad electrode VSPD so as to directly receive source voltage. The source voltage, which is applied to the cathode 160, may be ground voltage or positive (+) or negative (−) constant voltage. The voltage supplied to the cathode 160 may also be referred to as ground source voltage or VSS voltage so as to be distinguished from driving source voltage (VDD voltage) supplied to a driving transistor connected to a light emitting element OLED, which is a circuit component provided in a subpixel. In general, the driving source voltage is higher than the ground source voltage; however, the present disclosure is not limited thereto. The source voltage supplied to the connection line 130 via the link pattern 110*b* is uniformly supplied to the cathode 160 extending so as to cover the entirety of the display area AA and to cover at least the connection line 130 of the non-display area NA. Particularly, in the light emitting display device according to the present disclosure, the connection portion CTS between the cathode 160 and the connection line 130 is formed along one side of the display area AA of the substrate in a linear shape, whereby source voltage may be uniformly supplied from the connection portion CTS in a vertical direction.

The data pad electrodes DPD and the power voltage pad electrode VSPD may be formed so as to have a structure including two or more layers. As an example, as shown, a source metal layer 131 located on the same layer as at least one electrode constituting a thin film transistor TFT and a dummy anode located on the same layer as an anode 150 of the light emitting element OLED may be included. The power voltage pad electrode VSPD may be electrically or integrally connected to a protruding pattern 110*c* integrally formed with the link pattern 110*b*.

The link pattern 110*b* may overlap the trench T while having a larger area than each link line 110*a*, and a buffer layer 120 may be interposed between each link line 110*a* and the trench T.

FIG. 1 shows an example in which only the data lines 110 are provided in the display area AA; however, a source voltage line may also be provided in the display area AA of the substrate 100 so as to be parallel to the data lines 110 as needed. A concrete embodiment thereof will be described with reference to FIGS. 6 and 7.

A plurality of subpixels may be disposed in the display area AA of the substrate 100, and each subpixel may include an emission portion EM shown in region A of FIG. 1. The emission portion EM may be defined in an open area of a bank 170. The area other than the emission portion EM may be defined as a non-emission portion or a non-transmission portion TA.

The subpixel includes at least one thin film transistor TFT and a light emitting element OLED connected thereto for independent driving.

The thin film transistor TFT may include a semiconductor layer 122, a gate electrode 134 overlapping a channel of the semiconductor layer 122, and a source electrode 132 and a drain electrode 133 connected to opposite sides of the semiconductor layer 122. The drain electrode 133 of the thin film transistor TFT is connected to an anode 150 of the light emitting element OLED.

The semiconductor layer 122 may include at least one of polysilicon, amorphous silicon, and an oxide semiconductor. Depending on circumstances, a semiconductor layer having other properties may be used.

The thin film transistor TFT shown may have a top gate structure; however, the present disclosure is not limited thereto. The thin film transistor may be changed so as to have a bottom gate structure, or gate electrodes may be provided above and under the semiconductor layer 122. When the subpixel is provided with a plurality of thin film transistors, the thin film transistors may have different shapes.

Meanwhile, in the thin film transistor TFT shown, the gate electrode 134, the source electrode 132, and the drain electrode 133 are located on the same layer; however, the present disclosure is not limited thereto. An interlayer insulating film may be further interposed between the gate electrode 134 and the source electrode 132 and the drain electrode 133, and may be formed on another metal layer.

The light emitting element OLED is constituted by a stack of an anode 150, an organic layer 155, and a cathode 160. Depending on an emission direction, one of the anode 150 and the cathode 160 may be a transparent electrode made of ITO, IZO, or ITZO, and the other may be a reflective electrode made of Al, Ag, or an AgMg alloy. When the light emitting display device is a transparent display device, both the anode 150 and the cathode 160 may be transparent electrodes, or the anode 150 may be removed so as to correspond to the transmission portion and the cathode 160 may remain as a transparent or transflective electrode.

The connection line 130 may be located on the same layer as at least one electrode of the thin film transistor TFT. The connection line 130 is connected to the link pattern 110b located between two adjacent pad units PAD spaced apart from each other so as to correspond to adjacent printed circuit films 250 at the connection portion CTS in order to receive a source voltage signal. The link pattern 110b and the link lines 110a may be located on the same layer as a shielding metal configured to shield the semiconductor layer 122 thereunder, and the shielding metal may function as a data line 110d. The link pattern 110b and a protruding pattern directed from the link pattern 110b to the power voltage pad electrode VSPD may be integrated. The source metal layer 131 of the power voltage pad electrode VSPD and the data pad electrodes DPD may be connected to a shielding metal layer 110e therearound. The link pattern 110b is spaced apart from the link line 110a. The protruding pattern 110c may be integrally formed with the link pattern 110b.

Meanwhile, each of the data line 110d, the link lines 110a, the link pattern 110b, the protruding pattern 110c, and the shielding metal layer 110e may include a highly conductive metal, such as copper, molybdenum, aluminum, or titanium. However, the present disclosure is not limited thereto. Another material may be used as long as it is possible to supply source voltage and data voltage to the data line 110d, the link lines 110a, the link pattern 110b, the protruding pattern 110c, and the shielding metal layer 110e while uniform conductivity is maintained over the entire area of the substrate 100. In addition, each of the data line 110d, the link lines 110a, the link pattern 110b, the protruding pattern 110c, and the shielding metal layer 110e, which is the lowest metal layer of the substrate 100, may include a metal or material having tolerance to impurities introduced from the substrate 100 or having the ability to collect conductive impurities.

A buffer layer 120 may be provided so as to cover the data line 110d, the link lines 110a, the link pattern 110b, the protruding pattern 110c, and the shielding metal layer 110e, and an interlayer insulating film 125 may be provided on the buffer layer 120 so as to cover the semiconductor layer 122.

Each of the buffer layer 120 and the interlayer insulating film 125 may be any one of a silicon oxide film, a silicon nitride film, or a silicon oxynitride film. Depending on circumstances, at least one of the buffer layer 120 and the interlayer insulating film 125 may have a multilayered structure. In the multilayered structure, an oxide film or a nitride film including a metal other than silicon may be included.

A connection line 130, a source metal layer 131, a gate electrode 122, a source electrode 132, and a drain electrode 133 may be formed on the interlayer insulating film 125. Each of the connection line 130, the source metal layer 131, the gate electrode 122, the source electrode 132, and the drain electrode 133 may include a highly conductive metal, such as copper, molybdenum, aluminum, chromium, or titanium.

A passivation film 135 and a planarization layer 140 are sequentially formed so as to cover the connection line 130, the source metal layer 131, the gate electrode 134, the source electrode 132, and the drain electrode 133. The passivation film 135 may be an inorganic insulating film, and the planarization layer 140 may be an organic insulating film. Depending on circumstances, the passivation film 135 may be omitted.

After formation of the planarization layer 140, a trench T may be defined in a selective removal process of the planarization layer 140 and the passivation film 135. That is, the trench T is formed by further removing the passivation film 135 as well as the planarization layer 140 such that the connection line 130 protrudes. In the case in which the passivation film 135 is omitted, only the planarization layer 140 may be selectively etched to form the trench T. The trench T is also formed in a process of forming a first contact hole CT1 for connection between the drain electrode 133 of the thin film transistor TFT and the anode 150, and the portion of the trench T from which the planarization layer 140 and the passivation film 135 are removed becomes a second contact hole CT2. During formation of the second contact hole CT2, a third contact hole CT3 configured to expose the source metal layer 131 of the data pad electrodes DPD and the power voltage pad electrode VSPD is also formed. In one embodiment, the second contact hole CT2 on the link line 110a as shown in FIG. 4 and the second contact hole CT2 on the link pattern 110b as shown in FIG. 3 may be divided according to independent trenches T on the separated the link line 110a and the link pattern 110b. In another embodiment, the trench T fully extends through the planarization layer 140 and is continuous on the link line 110a and the link pattern 110b.

A transparent electrode is deposited on the planarization layer 140, including the first contact hole CT1, the second contact hole CT2, and the third contact hole CT3, and is selectively removed to form an anode 150 connected to the drain electrode 133 in the first contact hole CT1. In addition, dummy anodes 150a and 151 remain in the second contact hole CT2 and the third contact hole CT3, respectively. Depending on circumstances, the dummy anode 150a in the second contact hole CT2 may be omitted.

A bank 170 configured to expose the emission portion EM of each subpixel is provided on the planarization layer 140. In the display area AA, the bank 170 may be formed so as to overlap the edge of the anode 150.

An organic layer 155 and a cathode 160 are formed on the anode 150 to constitute a light emitting element OLED.

The organic layer 155 may include a hole injection layer, a hole transport layer, an emission layer, an electron transport layer, and an electron injection layer. Thereamong, the emission layer may be formed so as to correspond to the emission portion EM using a fine metal mask for each subpixel. The other layers excluding the emission layer, i.e., the hole injection layer, the hole transport layer, the electron transport layer, and the electron injection layer, which are common layers, may be formed using a common mask so as to correspond to at least the entirety of the display area AA without subdivision for each subpixel.

Depending on circumstances, when the organic layer 155 includes a plurality of stacks, the emission layer is divided so as to correspond to the plurality of stacks together with the common layers, and the plurality of stacks may be divided by a charge generation layer. In this case, the emission layers of the plurality of stacks may be integrally formed so as to correspond to the entirety of the display area AA together with the common layers.

A passivation film or a capping layer may be further included on the light emitting element OLED.

The light emitting display device has an opposite substrate 200 opposite the substrate 100, and further includes an adhesive layer 180 between the opposite substrate 200 and the substrate 100 having the light emitting element OLED formed thereon. For uniform lamination between the substrates 100 and 200, the adhesive layer 180 is formed so as to compensate for a step of an array formed on the substrate and to fill the interior of the trench T. The adhesive layer 180 may include an insulating material having a function of encapsulating the light emitting element OLED and a permeation prevention function in addition to an adhesive component.

Each of the substrate 100 and the opposite substrate 200 may include any one of a glass substrate, a plastic film, and a metal substrate. Depending on an emission direction, one of the substrate 100 and the opposite substrate 200 may be transparent, and the other may be opaque.

In the light emitting display device according to the first embodiment of the present disclosure, the linear connection portion CTS parallel to one side of the substrate 100 is provided so as to traverse the link lines 110a, wherein the connection line 130 formed so as to have a predetermined width in the link lines 110a and the cathode 160 are connected to each other via the linear connection portion CTS in a longitudinal direction of the substrate. Consequently, it is not necessary to increase or change the link lines 110a, and therefore it is possible to reduce the distance "a" between the pad unit PAD and the connection portion CTS.

In addition, the trench T is defined in the planarization layer 140, the cathode 160 and the connection line 130 may be connected to each other via the trench T, and the linear trench T divides paths above and under the trench, whereby it is possible for the trench T to prevent external moisture or external air from being introduced into the display area AA.

Meanwhile, in the light emitting display device according to the present disclosure, at least triple connection among the connection line 130, the dummy anode 150a, and the cathode 160 is possible in the linear trench, and the link pattern 110b connected to the power voltage pad electrode VSPD is directly connected to the lower side of the connection line 130 under the trench T such that an electrical signal is introduced, whereby it is possible to improve conductivity through stacking of a plurality of metal layers at the connection region and to supply source voltage to the cathode 160 at low resistance.

Figure 5:
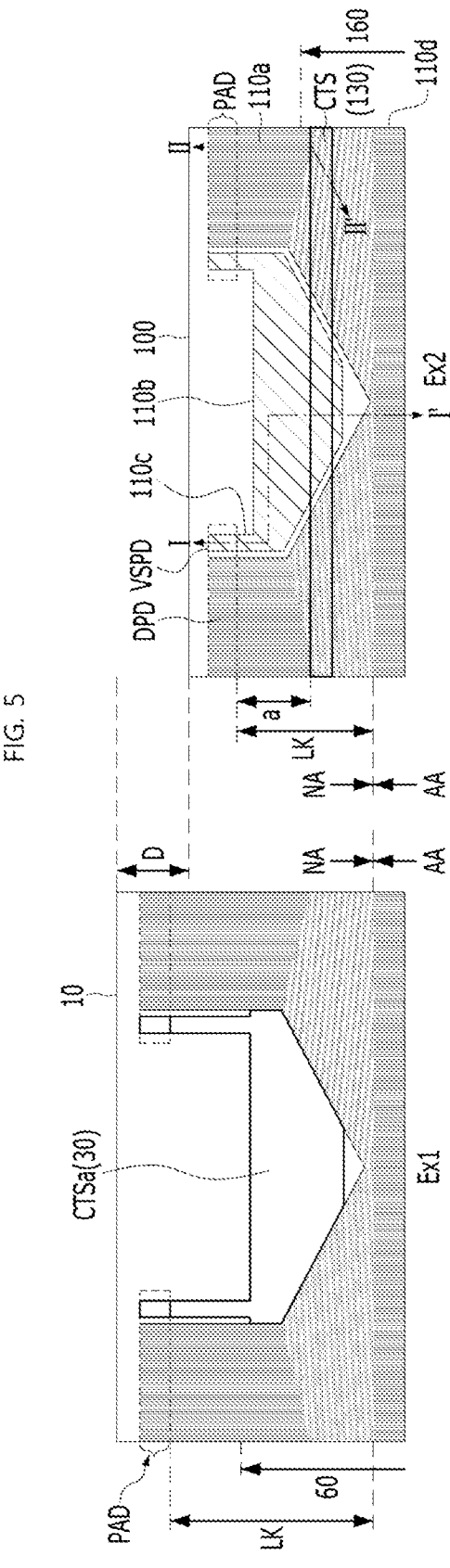
FIG. 5 is a plan view showing the construction of a cathode and a connection portion configured to supply source voltage in a first experimental example and a second experimental example.

FIG. 5 is a plan view showing the construction of a cathode and a connection portion configured to supply source voltage in a first experimental example and a second experimental example. The first experimental example (Ex1) shows a point connection portion, and the second experimental example (Ex2) shows a linear connection portion, as in the light emitting display device according to the first embodiment of the present disclosure.

As shown in FIG. 5, the first experimental example (Ex1) shows the state in which a connection pattern 30 directly connected to a power voltage pad electrode is located between adjacent pad units PAD and the connection pattern 30 on a substrate 10 is connected to a cathode 60. In order to supply a predetermined level of source voltage to the cathode 60, the light emitting display device according to the first experimental example (Ex1) requires a connection portion CTSa having a predetermined area. Consequently, when the local connection portion CTSa is provided between adjacent pad units PAD, as in the first experimental example (Ex1), there is a problem in that a link unit LK is lengthened in order to secure the area of the local connection portion CTSa required to supply a predetermined level of source voltage.

In contrast, in the light emitting display device according to the second experimental example (Ex2) (first embodiment of the present disclosure), a linear contact portion CTS between the connection line 130 and the cathode 160 is uniformly provided along one side of the substrate 100, not confining the local area between adjacent pad units PAD. Thus, a link line 110a has the minimum length required for connection between data lines 110d and the pad units PAD since the link line 110a does not depend on a length of the link pattern 110b. A cathode 160, a connection line 130, and a linear connection portion CTS are provided so as to overlap the link line 110a, whereby it is not necessary to increase the length of a link unit LK in order to supply voltage to the cathode 160, and therefore it is possible to reduce the length of a non-display area NA by distance "D," compared to the first experimental example (Ex1).

Meanwhile, in the light emitting display device, it is beneficial for the cathode 160 on the substrate 100 to have at least the same end as the connection line 130 or further extend to the outside than the end of the connection line 130 in order to provide the connection portion CTS. In addition, the end of an encapsulation portion, such as the opposite substrate 200 or the adhesive layer 180, may be located outside the cathode 160 and inside the pad unit PAD in order to protect the cathode 160. In the light emitting display device according to the first embodiment of the present disclosure, there is an advantage in that, due to the linear connection portion CTS having a small width, it is possible to secure the region in which the opposite substrate 200 and the adhesive layer 180 are located outside the connection portion CTS in the link unit LK without increasing the length of the link line 110a, whereby it is possible to stably supply source voltage without increasing the non-display area. Also, in order to achieve reliability in prevention of permeation, the trench T of the planarization layer 140 at which connection is performed is used as the connection portion CTS, the connection portion CTS is covered by the opposite substrate 200 and the adhesive layer 180, whereby the opposite substrate 200 and the adhesive layer 180 protect the trench T, and a permeation path due to the planarization layer 140e located around the trench T may be blocked by the trench T when viewed in plan.

Hereinafter, a light emitting display device having another shape will be described.

Figure 6:
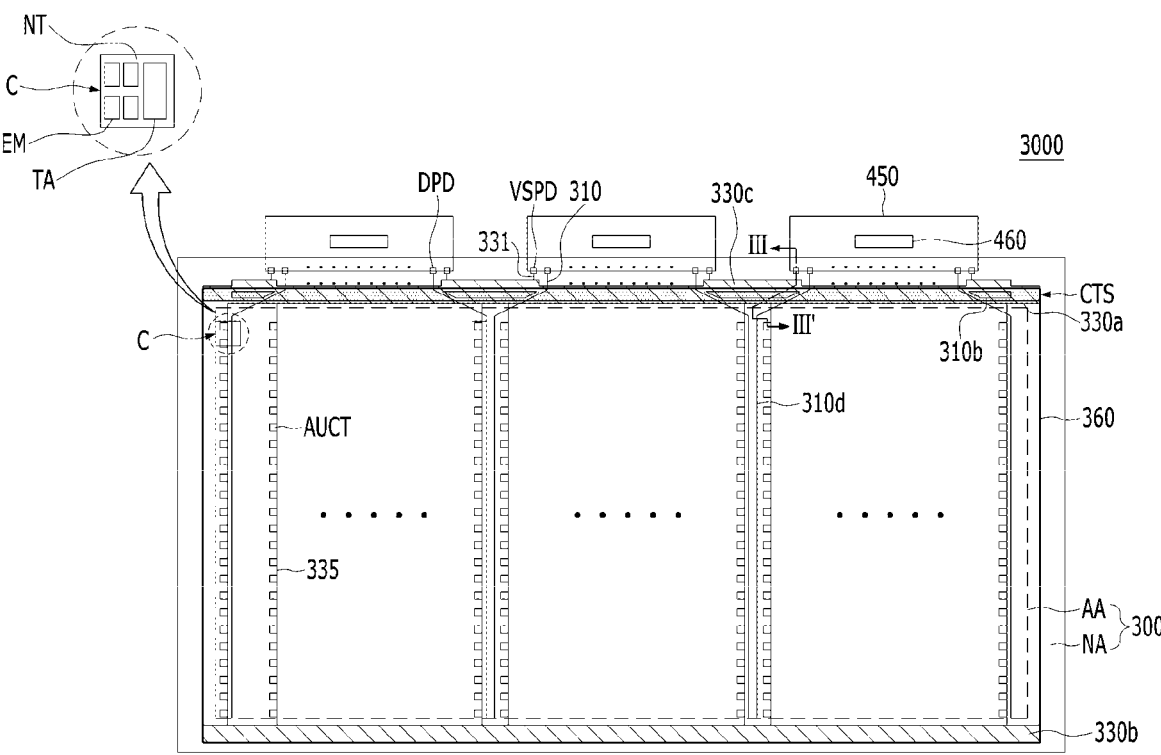
FIG. 6 is a plan view showing a light emitting display device according to a second embodiment of the present disclosure.
Figure 7:
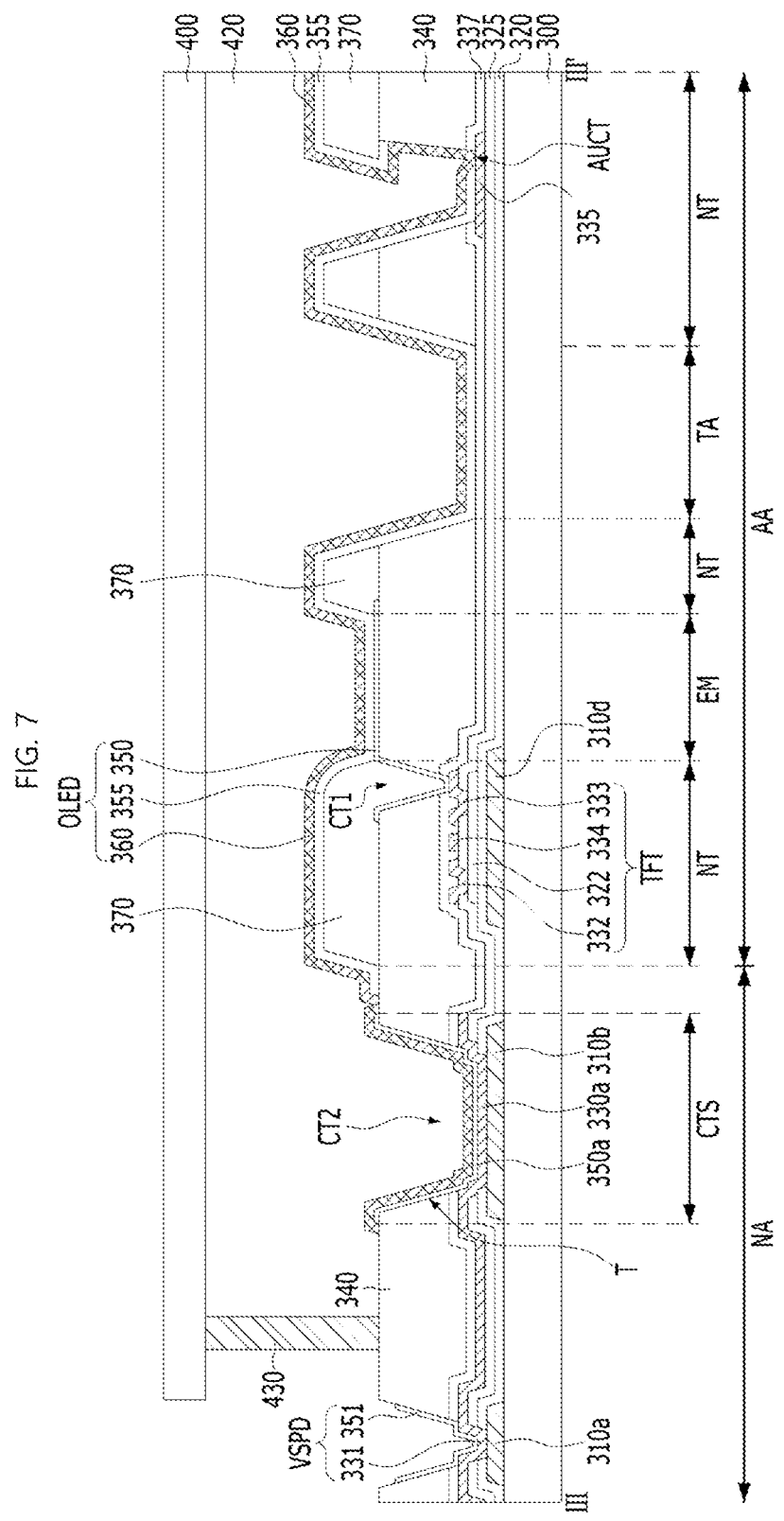
FIG. 7 is a sectional view taken along line III-III' of FIG. 6.

FIG. 6 is a plan view showing a light emitting display device according to a second embodiment of the present disclosure, and FIG. 7 is a sectional view taken along line III-III' of FIG. 6.

As shown in FIGS. 6 and 7, in the light emitting display device according to the second embodiment of the present disclosure, a plurality of source voltage lines 335 is further provided in a display area AA in addition to a plurality of data lines 310d, and the source voltage lines 335 and an auxiliary connection portion AUCT are provided in a non-transmission portion NT, compared to the first embodiment.

When the light emitting display device has a large screen size and a connection portion CTS is provided in only a non-display area NA, the distance from the connection portion CTS in the display area AA is increased. In order to secure uniform luminance without decrease in luminance, therefore, the source voltage lines 335 and the auxiliary connection portion AUCT are provided at a cathode 360. When the display area has a transmission portion TA in addition to an emission portion EM, as indicated by region C, the cathode 360 formed over at least the entirety of the display area AA in order to secure transparency of the transmission portion TA may be a transparent electrode made of ITO, IZO, or ITZO, or may be made of at least one of silver, magnesium, ytterbium, and strontium or an alloy thereof in order to exhibit reflective transparency.

In the emission portion EM, a microcavity must be implemented between the cathode 360 and an anode 350, and transparency must be maintained at the transmission portion TA. When the light emitting display device is implemented by a transparent display device, the cathode 360 must have a small thickness. In particular, when the cathode 360 is a transparent electrode and an oxide metal that includes oxygen, has high resistance, and is transflective is used, a thickness of 200 Å or less is required for transparency of the transmission portion, and therefore the resistance of the cathode 360 formed over the entirety of the display area AA may be high.

In the light emitting display device 3000 according to the second embodiment of the present disclosure, the cathode 360 and the auxiliary connection portion AUCT are provided in the non-transmission portion NT for each source voltage line 335 using an undercut structure in the display area AA.

In the undercut structure shown in FIG. 7, a planarization layer 340 is provided under a bank 370. However, the present disclosure is not limited thereto. Another construction on the source voltage lines 335 may be applied to the undercut structure.

As previously described, a light emitting element OLED is constituted by a stack of an anode 350, an organic layer 355, and a cathode 360. Thereamong, the organic layer 355 includes an emission layer and a plurality of common layers, and at least the common layers do not use a fine metal mask. Since step coverage characteristics of an organic material that is evaporated and deposited are low when the undercut structure is applied, however, the organic layer 355 is not stacked at the side of the planarization layer 340 at the inside of the bank 370, which further protrudes, and the portion of the source voltage line 335 under the bank 370, and therefore the cathode 360 formed immediately after the organic layer 355 is connected to the source voltage line 335, on which the organic layer 355 is not stacked, to constitute the auxiliary connection portion AUCT.

The source voltage lines 335 provided in the display area AA may extend to the non-display area NA so as to be connected to first and second connection lines 330a and 330b formed in the non-display area NA so as to have a linear shape in one direction of a substrate 300, and may receive a source voltage signal.

The first and second connection lines 330a and 330b and the source voltage lines 335 may be formed on the same layer as a source electrode 332 and a drain electrode 333 of a thin film transistor TFT; however, the present disclosure is not limited thereto. When the first and second connection lines 330a and 330b and the source voltage lines 335 are made of the same metal and are formed on the same layer, no separate connection process is required, and therefore it is possible to reduce the number of processes and to prevent decrease in yield due to misalignment during a contact process.

As an example, as shown in FIG. 6, a power voltage pad electrode VSPD may include a first metal layer 310a located on the same layer as a shielding metal layer (e.g., data line 310d), a second metal layer 331 located on the same layer as the source electrode 332, and a dummy anode layer 351 located on the same layer as the anode 350. Although the power voltage pad electrode VSPD is shown as a stack of three electrode layers, any one thereof may be omitted as needed, or when a separate metal layer is further provided on the substrate 300, the added metal layer may be further included in the stack structure.

The thin film transistor TFT may include a semiconductor layer 322, a gate electrode 334 overlapping a channel of the semiconductor layer 322, and a source electrode 332 and a drain electrode 333 connected to opposite sides of the semiconductor layer 322. The drain electrode 333 of the thin film transistor TFT is connected to the anode 350 of the light emitting element OLED.

The light emitting element OLED is constituted by a stack of an anode 350, an organic layer 355, and a cathode 360. Depending on an emission direction, one of the anode 350 and the cathode 360 may be a transparent electrode made of ITO, IZO, or ITZO, and the other may be a reflective electrode made of Al, Ag, or an AgMg alloy. When the light emitting display device is a transparent display device, as shown in FIG. 6, the anode 350 may be removed from the transmission portion TA and the cathode 360 may remain as a transparent or transflective electrode, as an example.

As shown in FIG. 6, the first connection line 330a is connected to a link pattern 310b located between two adjacent pad units PAD spaced apart from each other so as to correspond to adjacent printed circuit films 450. Each of the printed circuit films 450 may have a driving integrated circuit (IC) 460 thereon. As shown in FIG. 7, the link line 310 is connected to the second metal layer 331 at a power voltage pad electrode VSPD and receives a source voltage signal from the printed circuit film 450. The connection portion CTS is located at a link unit LK (Please see FIG. 5) along one side of the substrate 300. The link unit LK is provided between the pad unit PAD and a display area AA. The pad unit PAD includes the power voltage pad electrodes VSPD and the data pad electrodes DPD. The display area AA includes data lines 310d. The first connection line 330a at the connection portion CTS contacts with the link pattern 310b located below and contacts with and the cathode 360 located above. A dummy anode 350a may further be provided between the first connection line 330a and the cathode 360.

The link pattern 310b and the link line 310 may be located on the same layer as a shielding metal that blocks at least a channel region of the semiconductor layer 322 thereunder, and the shielding metal may function as the data line 310d. The shielding metal is located under the semiconductor layer 322. The source voltage lines 335 may be formed on the same layer as the first and second connection lines 330a and 330b, the overlapping link pattern 310b may be located on another layer, and the data line 310d integrally formed with the link pattern 310b in the display area AA and the source voltage lines 335 integrally formed with the first and second connection lines 330a and 330b in the display area AA may be located on different layers.

In the example of FIG. 6, a pattern 330c protrudes upwards from the first connection line 330a so as to correspond to the region between power voltage pad electrodes VSPD located at the outermost sides of adjacent printed circuit films 450, when viewed in plan. In this example, conductivity of the first connection line 330a is further improved using a space of the substrate 300 in which no link line 310 is formed, whereby reliability of the connection portion CTS is improved. However, the present disclosure is not limited thereto. The first and second connection lines 330a and 330b located above and below outside the display area AA may have the same shape.

Meanwhile, connection between the data pad electrode DPD and the data line 310d via the link line 310 is identical to the connection therebetween of FIG. 4, and therefore a description thereof will be omitted.

In the light emitting display device according to the second embodiment of the present disclosure, at least triple connection among the first connection line 330a, the dummy anode 350a, and the cathode 360 is possible in the linear trench CT2, and the link pattern 310b connected to the power voltage pad electrode VSPD is directly connected to the lower side of the first connection line 330a under the trench T such that an electrical signal is introduced, whereby it is possible to improve conductivity through stacking of a plurality of metal layers at the connection region and to supply source voltage to the cathode 360 at low resistance.

In the light emitting display device according to the second embodiment of the present disclosure, the first connection line 330a is provided so as to overlap the link line 310 between the data pad electrode DPD and the display area AA, and the connection portion CTS with the cathode 360 is provided by the first connection line 330a. That is, it is not necessary to increase the length of the link line 310 for supplying source voltage to the cathode 360, and therefore it is possible to reduce the length of the link line 310. Consequently, it is possible to reduce the length of the non-display area NA occupied by the link line 310, whereby it is possible to reduce a bezel, and therefore it is possible to maximize the effective area of the substrate.

In addition, when the light emitting display device is a transparent display device including a transmission portion, as shown in FIGS. 6 and 7, it is possible to reduce the length of the link line 310 occupied by an opaque metal component, whereby it is possible to improve transparency of the transparent display device.

In addition, the cathode 360 made of a thin transflective metal or an oxide metal having large resistance for transparency is applied to the entirety of the display area AA, and the source voltage line 335 and the auxiliary connection portion AUCT are further provided in the display area AA such that uniform voltage is provided for each area without decrease in voltage, whereby it is possible to equalize luminance while stabilizing an electric field in the display area AA, and therefore it is possible to improve reliability of the light emitting display device.

Also, in the light emitting display device according to the second embodiment of the present disclosure, the first connection line 330 may be provided in a line shape traversing the link line 310a connected to the data pad electrode DPD, and the first connection line 330a may be connected to the cathode 360 via the second contact hole CT2 formed in the shape of the trench T in the planarization layer 340 and the passivation film 337, whereby current supplied to the cathode 360 is uniformly supplied to the length of one side of the display area AA, and therefore it is possible to prevent heat from being concentrated on a local area. Also, in the light emitting display device according to the second embodiment of the present disclosure, a buffer layer 320 may be provided so as to overlay the data line 310d, and an interlayer insulating film 325 may be provided on the buffer layer 320 so as to overlay the semiconductor layer 322.

The trench shape of the second contact hole CT2 provided in the planarization layer 340 has a shape corresponding to the first connection line 330a and parallel to one side of the substrate 300, like the shape of the connection portion CTS of FIGS. 1 and 2, and is disposed outside at least the display area AA of the substrate 300 so as to have a uniform width, whereby moisture or external air outside the substrate 300 is blocked by the trench T. The planarization layer 340 may be made of a material that can be planarized in order to compensate for a step of an array configured thereunder such that an upper surface of the planarization layer is flat, such as an organic insulating material. The organic material may have relatively low resistance to moisture. In the light emitting display device according to the second embodiment of the present disclosure, however, an upper part and a lower part of the planarization layer 340 may be divided from each other in plan view by the trench T formed at one side outside the display area so as to extend along one side of the substrate, whereby it is possible to reduce or prevent the planarization layer 340 outside the display area from affecting the planarization layer 340 in the display area under the trench T. When the trench T is formed at one or more sides of the display area AA parallel to one side of the substrate 300 having the pad unit PAD, the effect of preventing permeation of moisture into the display area AA due to the trench T may be increased. In the light emitting display device according to the second embodiment of the present disclosure, therefore reliability in prevention of permeation may be improved based on the trench T formed by extending through the planarization layer 340.

Meanwhile, as shown in FIG. 7, in the light emitting display device according to the second embodiment of the present disclosure, an opposite substrate 400 opposite the substrate 300 having the light emitting element OLED formed thereon may be provided, a dam 430 may be provided between the substrate 300 and the opposite substrate 400 along the outer circumference of the opposite substrate 400, and the space of the dam 430 between the opposite substrate 400 and the substrate 300 may be filled with a filler 420, whereby an encapsulation structure may be formed. Here, the dam 430, the filler 420, and the opposite substrate 400 may be the encapsulation structure.

The encapsulation structure is not limited to the example shown in FIG. 7. Depending on circumstances, an inorganic film and an organic film may be alternately formed on the substrate 300 having the light emitting element OLED formed thereon, excluding the pad unit, whereby an encapsulation film stack may be implemented.

In the experimental example in which the connection portion connected to the cathode is locally provided between two adjacent pad units, source voltage is radially supplied from a local area, whereby heat is generated from the connection portion connected to the cathode; however, the light emitting display device according to the present disclosure is capable of solving such a heat generation problem.

In addition, in a structure in which a source voltage supply portion and the cathode are connected to each other in a local area, the non-display area is lengthened in order to provide a sufficient connection area. In the light emitting display device according to the present disclosure, however, the cathode and the connection line may be connected to each other through a line parallel to one side of the substrate adjacent to the data pad unit, whereby it is possible to reduce the length of a link unit between the data pads and the data lines.

A light emitting display device according to one aspect of the present disclosure may comprise a substrate including a display area and a non-display area outside the display area, a pad unit at one side of the non-display area, the pad unit comprising a plurality of data pad electrodes and a power voltage pad electrode, a plurality of data lines parallel to each other at the display area, a plurality of link lines to connect the data pad electrodes and the data lines to each other at the non-display area, a connection line provided parallel to one side of the substrate, the connection line traversing the plurality of link lines, a planarization layer to overlie the plurality of data lines, the planarization layer having a trench to expose the connection line and a cathode to overlie the display area, the cathode being connected to the connection line through the trench.

In a light emitting display device according to one aspect of the present disclosure, the trench may be provided parallel to one side of the substrate along the connection line so as to have a linear shape, and the connection line and the cathode are connected along a lower width of the trench.

In a light emitting display device according to one aspect of the present disclosure, the trench may have a horizontal distance between leftmost and rightmost ones of the data lines disposed at the display area.

In a light emitting display device according to one aspect of the present disclosure, the cathode may extend to at least an entirety of the display area and an outside of the display area so as to be integrally formed with an area comprising the trench.

In a light emitting display device according to one aspect of the present disclosure, the pad unit may be divided into a plurality of groups at one side of the substrate. The data pad electrodes and the power voltage pad electrode may be connected to a printed circuit film on the substrate for each of the plurality of groups. The plurality of groups may have a first horizontal distance therebetween greater than a distance between the data pad electrodes in each group.

In a light emitting display device according to one aspect of the present disclosure, the power voltage pad electrode may be located so as to correspond to an outermost side of the printed circuit film. The light emitting display device may further comprise a link pattern connected to the power voltage pad electrode of adjacent groups of the pad unit, and the link pattern may be connected to the connection line at the trench.

In a light emitting display device according to one aspect of the present disclosure, the link pattern may overlap the trench while having a larger area than each link line, and a buffer layer may be interposed between each link line and the trench.

In a light emitting display device according to one aspect of the present disclosure, the display area may comprise a non-transmission portion having the data lines provided therein and a transmission portion that does not overlap the data lines, the non-transmission portion is provided with a thin film transistor and a light emitting element connected to the thin film transistor. And the light emitting element may comprise an anode, an emission layer, and the cathode.

In a light emitting display device according to one aspect of the present disclosure, the connection line may be located on a same layer as at least one electrode of the thin film transistor.

In a light emitting display device according to one aspect of the present disclosure, the planarization layer may be provided on the thin film transistor, and the light emitting element may be located on the planarization layer.

A light emitting display device according to one aspect of the present disclosure may comprise a dummy anode provided between the connection line and the cathode connected to each other at the trench.

A light emitting display device according to one aspect of the present disclosure may comprise a plurality of power voltage lines parallel to the plurality of data lines at the display area. At least one power voltage line may have an auxiliary connection portion with the cathode.

In a light emitting display device according to one aspect of the present disclosure, the link lines and the data lines may be located on a same layer as a shielding metal layer provided under the thin film transistor.

A light emitting display device according to one aspect of the present disclosure may further comprise an auxiliary connection line portion facing the connection line in a state in which the display area is disposed therebetween.

In a light emitting display device according to one aspect of the present disclosure, the power voltage lines may be integrally connected on a same layer between the connection line and the auxiliary connection line portion.

A light emitting display device according to another aspect of the present disclosure may comprise a substrate including a display area comprising an emission portion and a transmission portion, and a non-display area outside the display area, a pad unit at one side of the non-display area, the pad unit comprising a plurality of data pad electrodes and a power voltage pad electrode, a plurality of data lines parallel to each other at the display area, a plurality of link lines to connect the data pad electrodes and the data lines to each other at the non-display area, a connection line parallel to one side of the substrate, the connection line traversing the plurality of link lines, a planarization layer to overlie the plurality of data lines, the planarization layer having a trench parallel to one side of the substrate along the connection line and a light emitting element on the planarization layer, the light emitting element comprising an anode, an organic layer, and a cathode. The cathode may be connected to the connection line through the trench.

In a light emitting display device according to another aspect of the present disclosure, the cathode may extend to at least an entirety of the display area and an outside of the display area so as to be integrally formed with an area comprising the trench.

A light emitting display device according to another aspect of the present disclosure may further comprise an encapsulation portion provided on the cathode, the encapsulation portion to fill the trench. An end of the encapsulation portion may be located on the planarization layer outside the trench.

A light emitting display device according to another aspect of the present disclosure may further comprise a dummy anode provided between the connection line and the cathode at the trench, the dummy anode being located on a same layer as the anode.

A light emitting display device according to another aspect of the present disclosure may further comprise connection with a shielding metal layer under the connection line at the trench.

A light emitting display device according to another aspect of the present disclosure may further comprise a power voltage line parallel to the data lines at the display area, the power voltage line further an auxiliary connection portion to connect the cathode. The data lines, the power voltage line, and the auxiliary connection portion do not overlap the transmission portion.

As is apparent from the above description, the light emitting display device according to the present disclosure has the following effects.

First, the connection line is provided in a line shape traversing the link lines connected to the data pad electrodes, the connection line is connected to the cathode, and current supplied to the cathode is uniformly supplied to the length of one side of the display area, whereby it is possible to prevent heat from being concentrated on a local area.

Second, in a structure in which the source voltage supply portion and the cathode are connected to each other in a local area, the non-display area is lengthened in order to provide a sufficient connection area. In the light emitting display device according to the present disclosure, however, the cathode and the connection line are connected to each other through a line parallel to one side of the substrate adjacent to the data pad unit, whereby it is possible to reduce the length of the link unit between the data pads and the data lines.

Third, the trench of the planarization layer is provided at the region at which the connection line and the cathode are connected to each other, whereby a permeation path due to the planarization layer outside the trench is blocked by the trench, and therefore it is possible to improve reliability of the light emitting display device.

Fourth, it is possible to reduce the distance between the data pad unit and the display area due to the shape of the linear connection portion between the cathode and the connection line, and therefore it is possible to reduce the area of the same substrate in which an opaque metal is used and to increase the area of the transmission portion that does not overlap the opaque metal. Consequently, it is possible to improve transparency when a transparent display device is used as the light emitting display device according to the present disclosure.

While the embodiments of the present disclosure have been described with reference to the accompanying drawings, the present disclosure is not limited to the embodiments and may be embodied in various different forms, and those skilled in the art will appreciate that the present disclosure may be embodied in specific forms other than those set forth herein without departing from the technical idea and essential characteristics of the present disclosure. The disclosed embodiments are therefore to be construed in all aspects as illustrative and not restrictive.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display device comprising:
a substrate including a display area and a non-display area outside the display area;
a pad unit at one side of the non-display area, the pad unit including a plurality of data pad electrodes and a power voltage pad electrode;
a plurality of data lines in the display area;
a plurality of link lines in the non-display area, the plurality of link lines electrically connected to the data pad electrodes and the data lines;
a connection line provided-on one side of the substrate, the connection line traversing the plurality of link lines;
a planarization layer to overlie the plurality of data lines, a trench in the planarization layer to expose the connection line; and
a cathode to overlie the display area, the cathode being electrically connected to the connection line through the trench,
wherein the pad unit is divided into a plurality of groups, the data pad electrodes and the power voltage pad electrode are connected to a printed circuit film on the substrate for each of the plurality of groups, and the plurality of groups have a first horizontal distance therebetween greater than a distance between the data pad electrodes in each group.

2. The light emitting display device according to claim 1, wherein
the trench is provided parallel to one side of the substrate along the connection line and has a linear shape, and
the connection line and the cathode are connected along a lower width of the trench.

3. The light emitting display device according to claim 1, wherein the trench has a horizontal distance between left-most and rightmost ones of the data lines disposed at the display area.

4. The light emitting display device according to claim 1, wherein the cathode extends to at least an entirety of the display area and an outside of the display area and integrally formed with an area including the trench.

5. The light emitting display device according to claim 1, wherein:
the power voltage pad electrode is located so as to correspond to an outermost side of the printed circuit film,
the light emitting display device further includes a link pattern connected to the power voltage pad electrode of adjacent groups of the pad unit, and
the link pattern is connected to the connection line at the trench.

6. The light emitting display device according to claim 5, wherein
the link pattern overlaps the trench while having a larger area than each link line, and
a buffer layer is interposed between each link line and the trench.

7. The light emitting display device according to claim 1, wherein
the connection line is parallel to the side of the substrate;
the display area includes a non-transmission portion having the data lines provided therein and a transmission portion that does not overlap the data lines,
the non-transmission portion is provided with a thin film transistor and a light emitting element connected to the thin film transistor, and
the light emitting element includes an anode, an emission layer, and the cathode.

8. The light emitting display device according to claim 7, wherein the connection line is located on a same layer as at least one electrode of the thin film transistor.

9. The light emitting display device according to claim 7, wherein
the planarization layer is provided on the thin film transistor, and
the light emitting element is located on the planarization layer.

10. The light emitting display device according to claim 7, further comprising a dummy anode provided between the connection line and the cathode connected to each other at the trench.

11. The light emitting display device according to claim 7, wherein the plurality of data lines are parallel to each other and further comprising:
a plurality of power voltage lines parallel to the plurality of data lines at the display area, wherein
at least one power voltage line has an auxiliary connection portion with the cathode.

12. The light emitting display device according to claim 7, wherein the link lines and the data lines are located on a same layer as a shielding metal layer provided under the thin film transistor.

13. The light emitting display device according to claim 7, further comprising an auxiliary connection line portion facing the connection line in a state in which the display area is disposed therebetween.

14. The light emitting display device according to claim 13, wherein the power voltage lines are integrally connected on a same layer between the connection line and the auxiliary connection line portion.

15. A light emitting display device comprising:
a substrate including a display area including an emission portion and a transmission portion, and a non-display area outside the display area;
a pad unit at one side of the non-display area, the pad unit including a plurality of data pad electrodes and a power voltage pad electrode;
a plurality of data lines parallel to each other at the display area;
a plurality of link lines in the non-display area, the plurality of link lines electrically connected to the data pad electrodes and the data lines;
a connection line parallel to one side of the substrate, the connection line traversing the plurality of link lines;
a planarization layer to overlie the plurality of data lines, the planarization layer having a trench parallel to one side of the substrate along the connection line;
a light emitting element on the planarization layer, the light emitting element including an anode, an organic layer, and a cathode; and
a dummy anode provided between the connection line and the cathode at the trench, the dummy anode being located on a same layer as the anode,
wherein the cathode is electrically connected to the connection line through the trench.

16. The light emitting display device according to claim 15, wherein the cathode extends to at least an entirety of the display area and an outside of the display area and integrally formed with an area including the trench.

17. The light emitting display device according to claim 15, further comprising:
an encapsulation portion provided on the cathode, the encapsulation portion to fill the trench, wherein
an end of the encapsulation portion is located on the planarization layer outside the trench.

18. The light emitting display device according to claim 15, further comprising connection with a shielding metal layer under the connection line at the trench.

19. The light emitting display device according to claim 15, further comprising:
a power voltage line parallel to the data lines at the display area and an auxiliary connection portion to connect the power voltage line and the cathode, wherein
the data lines, the power voltage line, and the auxiliary connection portion do not overlap the transmission portion.

20. A light emitting display device comprising:
a substrate having thereon a display area and a non-display area adjacent to the display area;
a thin film transistor having a first electrode, a second electrode, and a gate electrode;
a planarization layer over the thin film transistor and at least partially covering the display area and the non-display area;
a light emitting element on the planarization layer in the display area, the light emitting element comprising an anode, a cathode, and an organic layer between the anode and the cathode;
a trench fully extending through the planarization layer, the trench being located adjacent to and outside of the display area, and
a dummy electrode over the trench and below the cathode.

21. The light emitting display device of claim 20, wherein the substrate has a first direction and a second direction transverse to the first direction,
wherein the trench continuously extends in the first direction of the display device from a first location to a second location opposite the first location, and
wherein the first location is positioned adjacent to a first side surface of the display device and the second location is positioned adjacent to a second side surface of the display device.

22. The light emitting display device of claim 20, wherein the cathode of the light emitting element is disposed to cover an entirety of the display area.

23. The light emitting display device of claim 20, wherein at least a portion of the cathode of the light emitting element extends across the non-display area and at least partially overlaps the trench.

24. The light emitting display device of claim 23, wherein the cathode of the light emitting element contacts a top surface of the planarization layer.

* * * * *